US012588160B2

(12) United States Patent
Lu

(10) Patent No.: US 12,588,160 B2
(45) Date of Patent: Mar. 24, 2026

(54) POWER BOARD MODULE AND SERVER

(71) Applicant: SUZHOU METABRAIN INTELLIGENT TECHNOLOGY CO., LTD., Suzhou (CN)

(72) Inventor: Heng Lu, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 18/723,018

(22) PCT Filed: Sep. 28, 2022

(86) PCT No.: PCT/CN2022/122315
§ 371 (c)(1),
(2) Date: Jun. 21, 2024

(87) PCT Pub. No.: WO2024/000889
PCT Pub. Date: Jan. 4, 2024

(65) Prior Publication Data
US 2025/0126737 A1 Apr. 17, 2025

(30) Foreign Application Priority Data
Jun. 29, 2022 (CN) .......................... 202210748387.3

(51) Int. Cl.
*H05K 7/14* (2006.01)
(52) U.S. Cl.
CPC .................................. *H05K 7/1492* (2013.01)

(58) Field of Classification Search
CPC .. H05K 7/1402; H05K 7/1404; H05K 7/1405; H05K 7/1407; H05K 7/1408;
(Continued)

(56) References Cited

U.S. PATENT DOCUMENTS 5,383,793 A * 1/1995 Hsu ...................... H05K 7/1405
361/801
5,457,608 A * 10/1995 Scholder .............. H05K 7/1417
361/752
(Continued)

FOREIGN PATENT DOCUMENTS

CN 208241827 U 12/2018
CN 111782008 A 10/2020
(Continued)

*Primary Examiner* — Adrian S Wilson
(74) *Attorney, Agent, or Firm* — IPro, PLLC

(57) ABSTRACT

A power board module and a server are provided by the present application. The power board module includes: a chassis, a side wall of the chassis having a guiding groove; a power board bracket, wherein a power board is fixedly installed on the power board bracket, and a side wall of the power board bracket has an adjusting rod hanging groove; and an adjusting shifting piece module, wherein the adjusting shifting piece module has an installing portion matched with the adjusting rod hanging groove, and the installing portion is installed in the adjusting rod hanging groove; an end portion opposite to the installing portion has two adjusting elastic arms matched with the guiding groove, and the two adjusting elastic arms are clamped with two inner walls of the guiding groove, respectively.

20 Claims, 5 Drawing Sheets

(58) Field of Classification Search
 CPC .. H05K 7/1409; H05K 7/1417; H05K 7/1418;
 H05K 7/142; H05K 7/1421; H05K
 7/1489
 USPC ................................. 361/752, 756, 758, 759
 See application file for complete search history.

(56) References Cited

U.S. PATENT DOCUMENTS

| | | | | |
|---|---|---|---|---|
| 6,021,049 | A * | 2/2000 | Thompson | H05K 7/1405 |
| | | | | 361/801 |
| 6,442,037 | B1 * | 8/2002 | Boe | H05K 7/1408 |
| | | | | 361/801 |
| 6,497,464 | B1 * | 12/2002 | Cammack | A47B 88/493 |
| | | | | 312/334.44 |
| 6,579,029 | B1 * | 6/2003 | Sevde | H05K 7/1414 |
| | | | | 403/321 |
| 6,752,276 | B2 * | 6/2004 | Rumney | H05K 7/142 |
| | | | | 361/801 |
| 6,865,091 | B2 * | 3/2005 | Hsu | H05K 7/142 |
| | | | | 361/801 |
| 6,992,249 | B2 * | 1/2006 | Gustine | H05K 5/10 |
| | | | | 361/801 |
| 7,149,094 | B2 * | 12/2006 | Li | H05K 7/142 |
| | | | | 361/801 |
| 7,969,746 | B2 * | 6/2011 | Hoff | G06F 3/023 |
| | | | | 361/747 |
| 12,422,904 | B2 * | 9/2025 | Chen | G06F 1/20 |
| 2003/0109157 | A1 * | 6/2003 | Koerber | H01R 13/62905 |
| | | | | 439/160 |
| 2004/0026345 | A1 * | 2/2004 | Rumney | H05K 7/142 |
| | | | | 211/41.17 |
| 2014/0070064 | A1 * | 3/2014 | Chen | H05K 7/1489 |
| | | | | 248/221.11 |

FOREIGN PATENT DOCUMENTS

| | | | |
|---|---|---|---|
| CN | 113301739 | A | 8/2021 |
| CN | 113721727 | A | 11/2021 |
| CN | 215341000 | U | 12/2021 |
| CN | 115023092 | A | 9/2022 |
| DE | 202004015297 | U1 | 12/2004 |
| JP | 2008095914 | A | 4/2008 |

\* cited by examiner

POWER BOARD MODULE AND SERVER

CROSS-REFERENCE TO RELATED APPLICATION

This application claims the priority of the Chinese Patent application filed on Jun. 29, 2022 before the China National Intellectual Property Administration with the application number of 202210748387.3, and the title of "POWER BOARD MODULE AND SERVER", which is incorporated herein in its entirety by reference.

FIELD

The present application relates to the field of computers and, more particularly, to a power board module and a server.

BACKGROUND

Power board modules are often used in processing devices to power the devices. For the power board modules, it is often necessary to accommodate the connection of different power supplies, such as power supplies of different lengths. In the related art, power board modules supporting power supplies of two specifications and lengths are manually assembled and adjusted in position using locating pins and screws, which requires a lot of manpower and time costs in operation.

SUMMARY

In view of this, an object of the embodiments of the present application is to provide a power board module and a server. The convenience of system maintenance may be increased by using the technical solution of the present application, with the advantages of easy installation, low time cost, and high versatility, thereby product competitiveness is increased.

Based on the object stated above, a power board module is provided by some embodiments of the present application, which includes:

a chassis, a side wall of the chassis having a guiding groove;

a power board bracket, wherein a power board is fixedly installed on the power board bracket, and a side wall of the power board bracket has an adjusting rod hanging groove; and an adjusting shifting piece module, wherein the adjusting shifting piece module has an installing portion matched with the adjusting rod hanging groove, and the installing portion is installed in the adjusting rod hanging groove; an end portion opposite to the installing portion has two adjusting elastic arms matched with the guiding groove, and the two adjusting elastic arms are clamped with two inner walls of the guiding groove, respectively; a locking portion for limiting an elastic range of the two adjusting elastic arms is disposed above the adjusting elastic arms, and the locking portion is configured to limit the elastic range of the two adjusting elastic arms when the two adjusting elastic arms are located at preset positions in the guiding groove so that the adjusting shifting piece module is fixed at the preset positions in the guiding groove.

According to an embodiment of the present application, the adjusting shifting piece module includes an adjusting rod; one end of the adjusting rod has the installing portion matched with the adjusting rod hanging groove, and the other end of the adjusting rod has an adjusting portion; a main body of the adjusting portion is provided with locking portion installing grooves, and an end portion of the adjusting portion has two adjusting elastic arms parallel to each other; an outer side of an outermost end portion of each of the two adjusting elastic arms is provided with a protruding portion clamped with the guiding groove, and an inner side of the outermost end portion of each of the two adjusting elastic arms is provided with a limiting point.

According to an embodiment of the present application, the adjusting shifting piece module includes a latching shifting piece, and the latching shifting piece is U-shaped; one end portion of the latching shifting piece is provided with movable shafts matched with the locking portion installing grooves, and the movable shaft moves from a starting position of the locking portion installing groove to an end position of the locking portion installing groove; the locking portion is disposed at a bottom of the latching shifting piece, and two sides of the locking portion have limiting grooves matched with the limiting points; when the latching shifting piece slides to the end position of the locking portion installing groove, the limiting points are clamped in the limiting grooves to limit the elastic range of the adjusting elastic arms.

According to an embodiment of the present application, a top of the adjusting rod has a first screw hole and a fool-proof protrusion, and a top of the latching shifting piece has a limiting concave point.

According to an embodiment of the present application, the power board module further includes:

an adjusting handle, wherein the adjusting handle is provided with a second screw hole, and the first screw hole is connected to the second screw hole via a screw to connect the adjusting handle and the adjusting rod together; a bottom surface of the adjusting handle is provided with a fool-proof hole matched with the fool-proof protrusion disposed on the adjusting rod, and the bottom surface of the adjusting handle is provided with a limiting convex point matched with the limiting concave point arranged on the latching shifting piece; when the latching shifting piece is located at the starting position of the locking portion installing groove, the limiting convex point is clamped with the limiting concave point.

According to an embodiment of the present application, the power board module further includes:

push pin guiding grooves, wherein the push pin guiding grooves are arranged on a bottom surface perpendicular to the side wall of the chassis and are L-shaped; each of the push pin guiding grooves has an installing groove and a sliding groove; the installing groove is perpendicular to the side wall of the chassis, and the sliding groove is parallel to the side wall of the chassis; an end portion of the installing groove has a push pin hole, and a diameter of the push pin hole is greater than a width of the installing groove.

According to an embodiment of the present application, two ends of the guiding groove have print fonts matched with lengths of power supplies to be installed, and the print fonts include 185 and 265.

According to an embodiment of the present application, two inner side walls of the guiding groove have sawtooth structures.

According to an embodiment of the present application, end portions of the two adjusting elastic arms have protruding portions matched with the sawtooth structures, and the protruding portions are tightly clamped with grooves of the sawtooth structures.

A server is further provided by some embodiments of the present application, wherein the server includes a power board module, the power board module includes:

a chassis, a side wall of the chassis having a guiding groove;

a power board bracket, wherein a power board is fixedly installed on the power board bracket, and a side wall of the power board bracket has an adjusting rod hanging groove; and an adjusting shifting piece module, wherein the adjusting shifting piece module has an installing portion matched with the adjusting rod hanging groove, and the install-ing portion is installed in the adjusting rod hanging groove; an end portion opposite to the installing portion has two adjusting elastic arms matched with the guid-ing groove, and the two adjusting elastic arms are clamped with two inner walls of the guiding groove, respectively; a locking portion for limiting an elastic range of the two adjusting elastic arms is disposed above the adjusting elastic arms, and the locking por-tion is configured to limit the elastic range of the two adjusting elastic arms when the two adjusting elastic arms are located at preset positions in the guiding groove so that the adjusting shifting piece module is fixed at the preset positions in the guiding groove.

According to an embodiment of the present application, the adjusting shifting piece module includes an adjusting rod; one end of the adjusting rod has the installing portion matched with the adjusting rod hanging groove, and the other end of the adjusting rod has an adjusting portion; a main body of the adjusting portion is provided with locking portion installing grooves, and an end portion of the adjust-ing portion has two adjusting elastic arms parallel to each other; an outer side of an outermost end portion of each of the two adjusting elastic arms is provided with a protruding portion clamped with the guiding groove, and an inner side of the outermost end portion of each of the two adjusting elastic arms is provided with a limiting point.

According to an embodiment of the present application, the adjusting shifting piece module includes a latching shifting piece, and the latching shifting piece is U-shaped; one end portion of the latching shifting piece is provided with movable shafts matched with the locking portion installing grooves, and the movable shaft moves from a starting position of the locking portion installing groove to an end position of the locking portion installing groove; the locking portion is disposed at a bottom of the latching shifting piece, and two sides of the locking portion have limiting grooves matched with the limiting points; when the latching shifting piece slides to the end position of the locking portion installing groove, the limiting points are clamped in the limiting grooves to limit the elastic range of the adjusting elastic arms.

According to an embodiment of the present application, a top of the adjusting rod has a first screw hole and a fool-proof protrusion, and a top of the latching shifting piece has a limiting concave point.

According to an embodiment of the present application, the server further includes:

an adjusting handle, wherein the adjusting handle is provided with a second screw hole, and the first screw hole is connected to the second screw hole via a screw to connect the adjusting handle and the adjusting rod together; a bottom surface of the adjusting handle is provided with a fool-proof hole matched with the fool-proof protrusion disposed on the adjusting rod and, the bottom surface of the adjusting handle is provided with a limiting convex point matched with the limiting concave point arranged on the latching shifting piece; when the latching shifting piece is located at the starting position of the locking portion installing groove, the limiting convex point is clamped with the limiting concave point.

According to an embodiment of the present application, the server further includes:

push pin guiding grooves, wherein the push pin guiding groove are arranged on a bottom surface perpendicular to the side wall of the chassis and are L-shaped; each of the push pin guiding grooves has an installing groove and a sliding groove; the installing groove is perpendicular to the side wall of the chassis, and the sliding groove is parallel to the side wall of the chassis; an end portion of the installing groove has a push pin hole, and a diameter of the push pin hole is greater than a width of the installing groove.

The present application has the following beneficial tech-nical effects. According to the technical solution provided by the embodiment of the present application, by disposing that the power board module includes the chassis, a side wall of the chassis having the guiding groove; the power board bracket, wherein the power board is fixedly installed on the power board bracket, and the side wall of the power board bracket has the adjusting rod hanging groove; and the adjusting shifting piece module, wherein the adjusting shift-ing piece module has the installing portion matched with the adjusting rod hanging groove, and the installing portion is installed in the adjusting rod hanging groove; the end portion opposite to the installing portion has two adjusting elastic arms matched with the guiding groove, and the two adjusting elastic arms are clamped with two inner walls of the guiding groove, respectively; the locking portion for limiting the elastic range of the two adjusting elastic arms is disposed above the adjusting elastic arms, and the locking portion is configured to limit the elastic range of the two adjusting elastic arms when the two adjusting elastic arms are located at the preset positions in the guiding groove so that the adjusting shifting piece module is fixed at the preset positions in the guiding groove, the convenience of system maintenance may be increased, with the advantages of easy installation, low time cost, and high versatility, thereby product competitiveness is increased.

BRIEF DESCRIPTION OF THE DRAWINGS

In order to illustrate the embodiments of the present application or the technical solutions in the related art more clearly, a brief description will be given below with refer-ence to the drawings which are needed to be used in the description of the embodiments or the related art, and it is obvious that the drawings in the description below are merely some embodiments of the present application, and a person skilled in the art may further obtain other embodi-ments according to these drawings without involving any creative efforts.

In the drawings.

DESCRIPTION OF REFERENCE NUMERALS

1—chassis, 2—guiding groove, 3—power board bracket, 4—power board, 5—adjusting rod hanging groove, 6—adjusting shifting piece module, 7—installing portion, 8—adjusting elastic arm, 9—locking portion, 10—adjusting rod, 11—locking portion installing groove, 12—protruding portion, 13—limiting point, 14—latching shifting piece, 15—movable shaft, 17—limiting groove, 18—first screw hole, 19—fool-proof protrusion, 20—limiting concave point, 21—adjusting handle, 22—second screw hole, 23—fool-proof hole, 24—limiting convex point, 25—push pin guiding groove, and 26—sawtooth structure.

DETAILED DESCRIPTION

Embodiments of the present disclosure are described below. However, it should be understood that the disclosed embodiments are merely examples and that other embodiments may take various alternative forms. The drawings are not necessarily drawn to scale. Certain functions may be exaggerated or minimized to show details of particular components. Therefore, structural and functional details disclosed herein are not to be interpreted as limiting, but merely as a representative basis for teaching a person skilled in the art to employ the present application by using various ways. As will be appreciated by a person skilled in the art, various features illustrated and described with reference to any one of the drawings may be combined with features illustrated in one or more of the other drawings to produce an embodiment not explicitly illustrated or described. The combination of features shown provides a representative embodiment for typical application. However, various combinations and modifications of features consistent with the teachings of the present disclosure may be desirable for certain application or implementations.

Unless defined otherwise, all technical and scientific terms used herein have the same meaning as commonly understood by a person skilled in the art to which the present application belongs. The terms used herein in the specification of the present application are for the purpose of describing embodiments only and are not intended to limit the present application. As used herein, the term "and/or" includes any and all combinations of one or more associated listed items.

Figure 1:
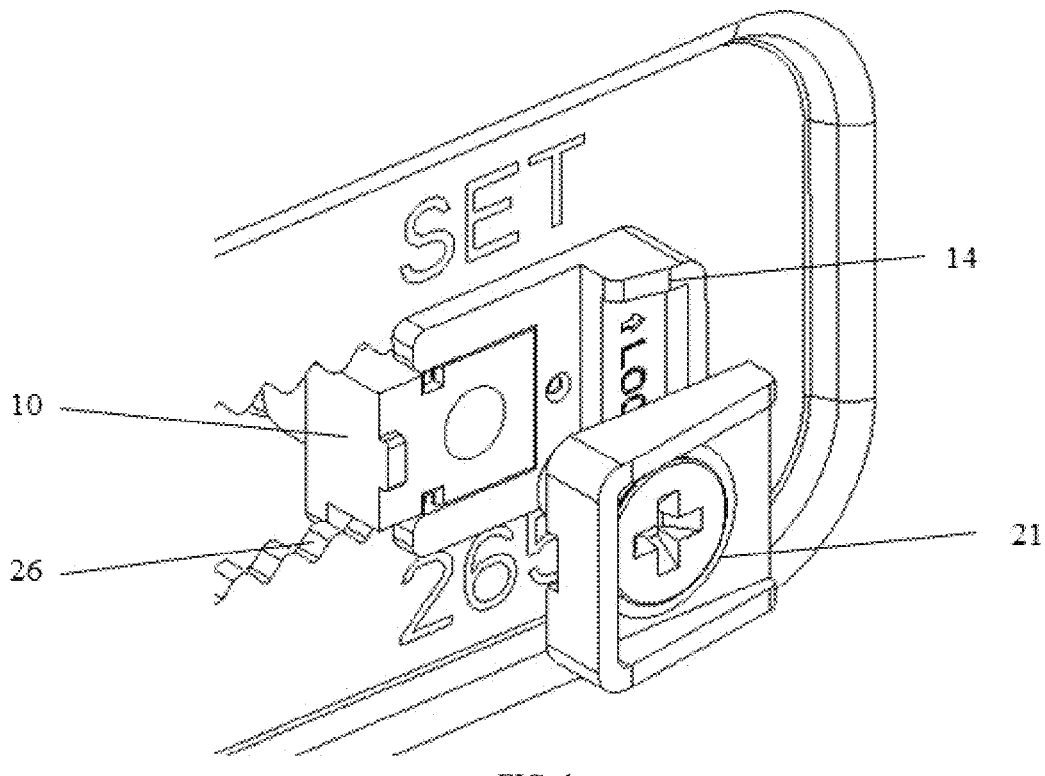
FIG. 1 is a schematic diagram of assembling an adjusting shifting piece module according to an embodiment of the present application.
Figure 2:
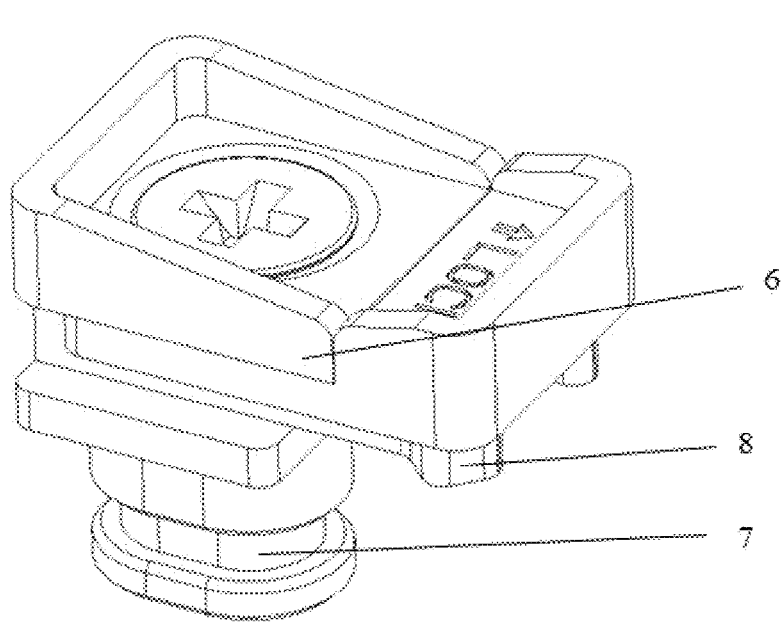
FIG. 2 is a schematic diagram of an adjusting shifting piece module according to an embodiment of the present application.
Figure 3:
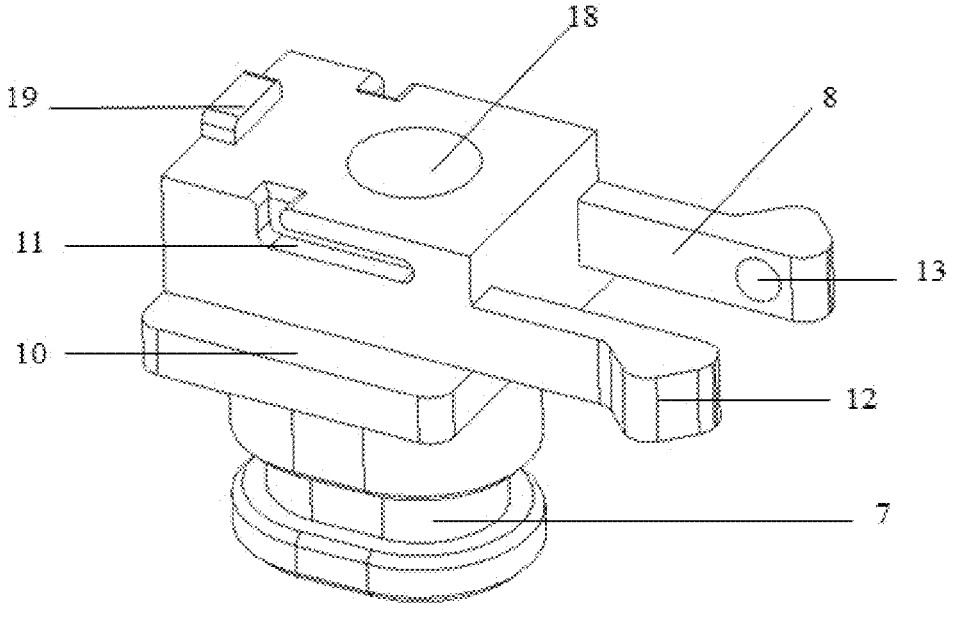
FIG. 3 is a schematic diagram of an adjusting rod according to an embodiment of the present application.
Figure 4:
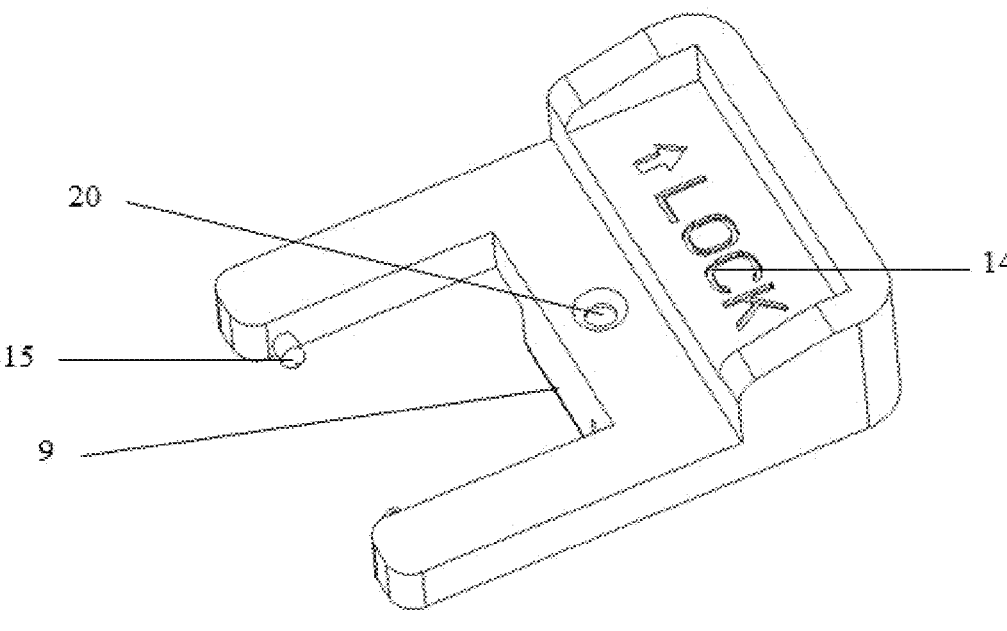
FIG. 4 is a schematic diagram of a latching shifting piece according to an embodiment of the present application.
Figure 5:
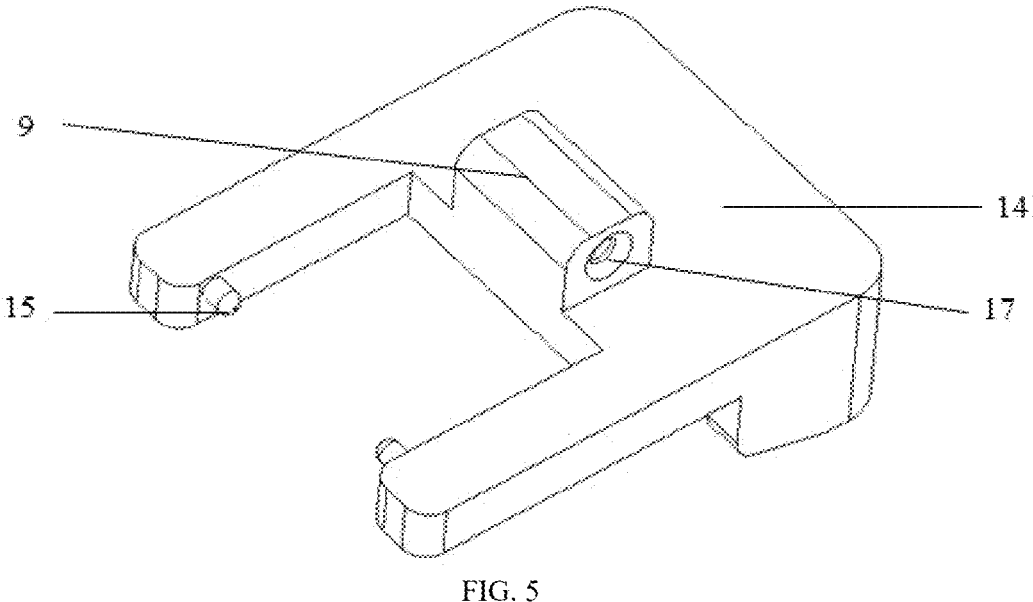
FIG. 5 is a schematic diagram of a rear view of a latching shifting piece according to an embodiment of the present application.
Figure 6:
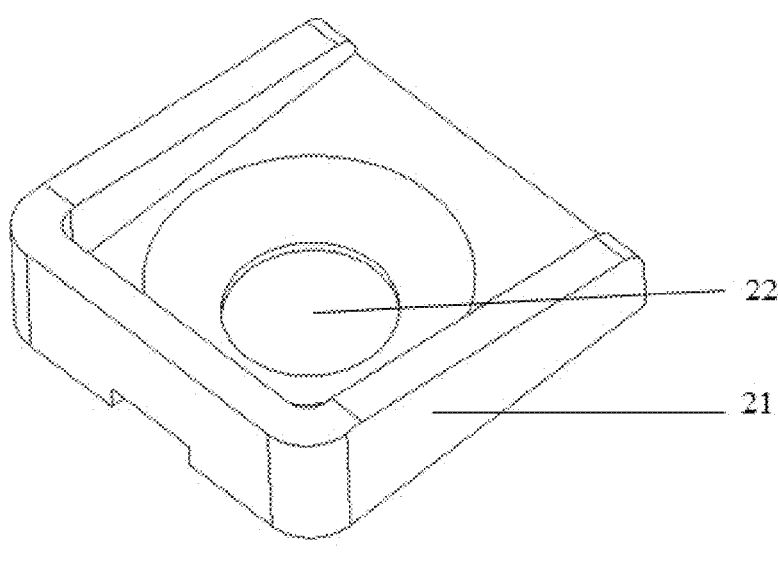
FIG. 6 is a schematic diagram of an adjusting handle according to an embodiment of the present application.
Figure 7:
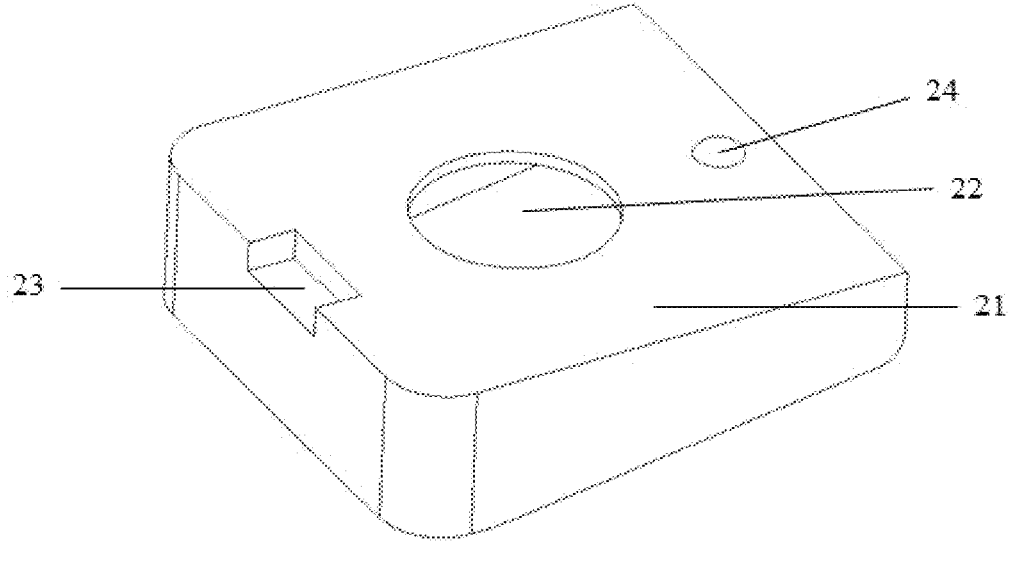
FIG. 7 is a schematic diagram of a rear view of an adjusting handle according to an embodiment of the present application.
Figure 8:
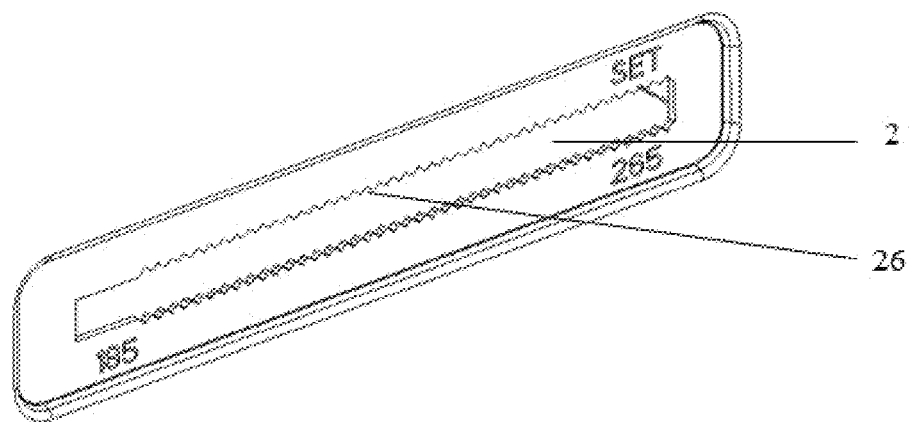
FIG. 8 is a schematic diagram of a guiding groove according to an embodiment of the present application.
Figures 9, 10:
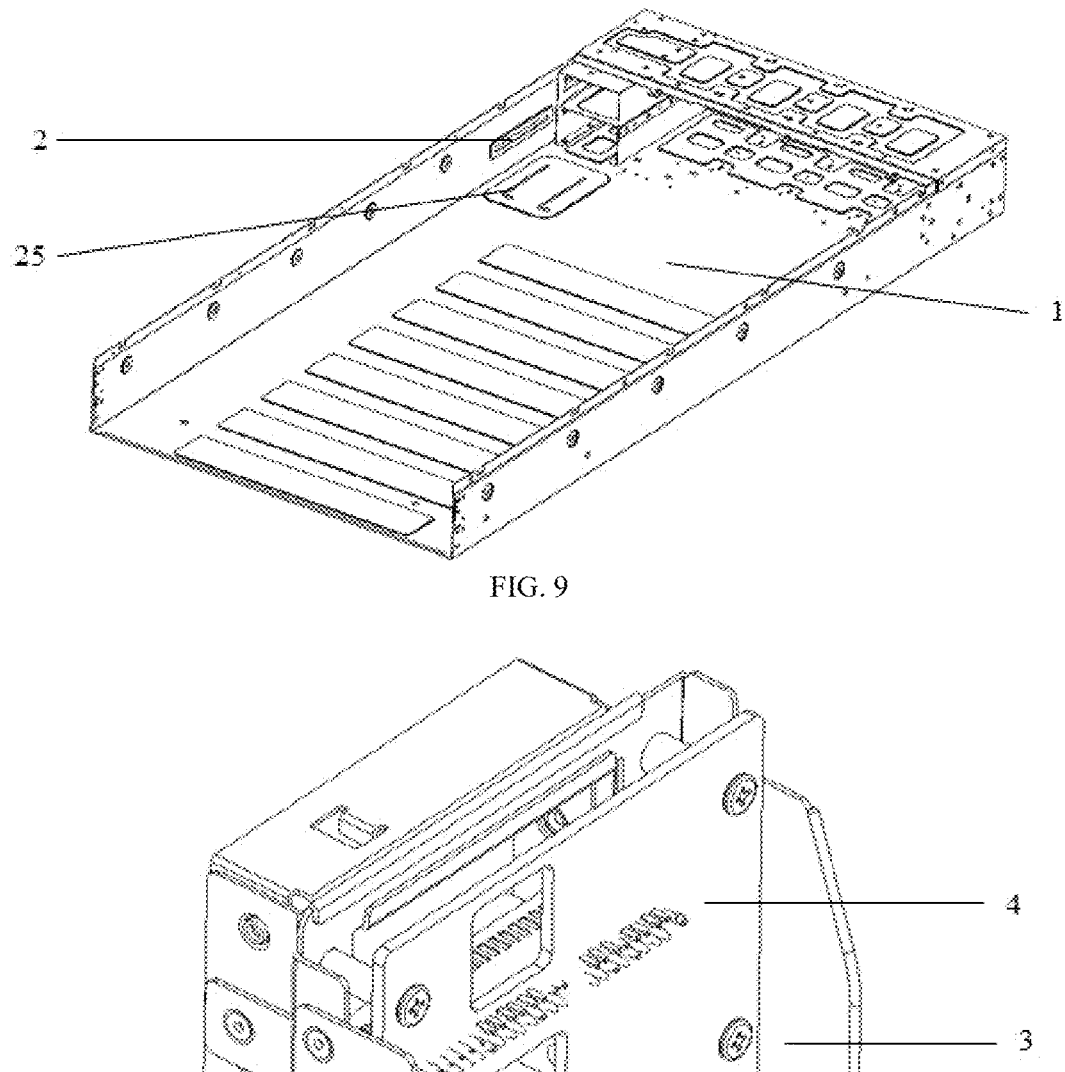
FIG. 9 is a schematic diagram of a chassis according to an embodiment of the present application.
FIG. 10 is a schematic diagram of a power board bracket according to an embodiment of the present application.

Based on the above-mentioned object, a power board module is provided by some embodiments of the present application. FIGS. 1-10 show schematic diagrams of the power board module.

As shown in FIGS. 1-10, the power board module may include a chassis 1, a power board bracket 3 and an adjusting shifting piece module 6.

A side wall of the chassis 1 has a guiding groove 2.

A power board 4 is fixedly installed on the power board bracket 3, and a side wall of the power board bracket 3 has an adjusting rod hanging groove 5. The power board 4 on the power board bracket 3 is configured to install power supplies, and power supplies to be installed include a 185 mm-long power supply and a 265 mm-long power supply.

The adjusting shifting piece module 6 has an installing portion 7 matched with the adjusting rod hanging groove 5, and the installing portion 7 is installed in the adjusting rod hanging groove 5. An end portion opposite to the installing portion 7 has two adjusting elastic arms 8 matched with the guiding groove 2, and the two adjusting elastic arms 8 are clamped with two inner walls of the guiding groove 2, respectively. A locking portion 9 for limiting an elastic range of the two adjusting elastic arms 8 is disposed above the adjusting elastic arms 8, and the locking portion 9 is configured to limit the elastic range of the two adjusting elastic arms 8 when the two adjusting elastic arms 8 are located at preset positions in the guiding groove 2 so that the adjusting shifting piece module 6 is fixed at the preset positions in the guiding groove 2. The installing portion 7 of the adjusting shifting piece module 6 is installed in the adjusting rod hanging groove 5 of the power board bracket 3. That is, the adjusting shifting piece module 6 is fixedly installed on the power board bracket 3, and the two adjusting elastic arms 8 in the adjusting shifting piece module 6 are clamped with two inner walls of the guiding groove 2 in the chassis 1 so that the chassis 1, the power board bracket 3, and the adjusting shifting piece module 6 may be in a determined position. Moreover, the two adjusting elastic arms 8 may move in the guiding groove 2, and the movement of the adjusting shifting piece module 6 drives the power board bracket 3 to move together. Thus, a position of the power board bracket 3 in the chassis 1 may be adjusted, that is, a position of the power board 4 is adjusted so that when power supplies of different lengths need to be installed, it is only necessary to adjust the positions of the two adjusting elastic arms 8 in the adjusting shifting piece module 6 to adjust the power board 4 to an exact position where the power supplies are installed. After the positions of the two adjusting elastic arms 8 are adjusted, the elastic range of the two adjusting elastic arms 8 may be locked via the locking portion 9. That is, the two adjusting elastic arms 8 cannot move in the guiding groove 2 due to elasticity, thus the position of the power board bracket 3 is fixed.

By using the technical solution of the present application, the installation of power supplies of different lengths may be facilitated, and the convenience of system maintenance may be increased, with the advantages of easy installation, low time cost, and high versatility, thereby product competitiveness is increased.

In an embodiment of the present application, the power board module may include a chassis 1, a power board bracket 3 and an adjusting shifting piece module 6.

A side wall of the chassis 1 has a guiding groove 2. The guiding groove 2 is horizontally arranged, and two inner side walls of the guiding groove 2 have sawtooth structures 26.

A power board 4 is fixedly installed on the power board bracket 3, and a side wall of the power board bracket 3 has an adjusting rod hanging groove 5.

The adjusting shifting piece module 6 includes an adjusting rod 10. One end of the adjusting rod 10 has an installing portion 7 matched with the adjusting rod hanging groove 5, and the other end of the adjusting rod 10 has an adjusting portion. A main body of the adjusting portion is provided with locking portion installing grooves 11, and an end portion of the adjusting portion has two adjusting elastic arms 8 parallel to each other. An outer side of an outermost end portion of each of the two adjusting elastic arms 8 is provided with a protruding portion 12 clamped with the guiding groove 2, and an inner side of the outermost end portion of each of the two adjusting elastic arms 8 is provided with a limiting point 13. The two adjusting elastic arms 8 are clamped with the sawtooth structure 26 of the two inner walls of the guiding groove 2, respectively, through the protruding portions 12. The two adjusting elastic arms 8 have a certain elasticity, and although the protruding portion 12 is clamped with the sawtooth structure 26, under the action of a force, the adjusting elastic arm 8 will be deformed inward so that the protruding portion 12 is detached from a currently clamped groove of the sawtooth structure 26 so that the adjusting shifting piece module 6 may move in the guiding groove 2. A locking portion 9 for limiting an elastic range of the two adjusting elastic arms 8 is disposed above the adjusting elastic arms 8, and the locking portion 9 is configured to limit the elastic range of the two adjusting elastic arms 8 when the two adjusting elastic arms 8 are located at preset positions in the guiding groove 2 so that the adjusting shifting piece module 6 is fixed at the preset positions in the guiding groove 2.

In an embodiment of the present application, the power board module may include a chassis 1, a power board bracket 3 and an adjusting shifting piece module 6.

A side wall of the chassis 1 has a guiding groove 2. Two inner side walls of the guiding groove 2 have sawtooth structures 26.

A power board 4 is fixedly installed on the power board bracket 3, and a side wall of the power board bracket 3 has an adjusting rod hanging groove 5.

The adjusting shifting piece module 6 includes an adjusting rod 10. One end of the adjusting rod 10 has an installing portion 7 matched with the adjusting rod hanging groove 5, and the other end of the adjusting rod 10 has an adjusting portion. A main body of the adjusting portion is provided with locking portion installing grooves 11, and an end portion of the adjusting portion has two adjusting elastic arms 8 parallel to each other. An outer side of an outermost end portion of each of the two adjusting elastic arms 8 is provided with a protruding portion 12 clamped with the guiding groove 2, and an inner side of the outermost end portion of each of the two adjusting elastic arms 8 is provided with a limiting point 13. The two adjusting elastic arms 8 are clamped with the sawtooth structure 26 of the two inner walls of the guiding groove 2, respectively, through the protruding portions 12. The two adjusting elastic arms 8 have a certain elasticity, and although the protruding portion 12 is clamped with the sawtooth structure 26, under the action of a force, the adjusting elastic arm 8 will be deformed inward so that the protruding portion 12 is detached from a currently clamped groove of the sawtooth structure 26 so that the adjusting shifting piece module 6 may move in the guiding groove 2. The adjusting shifting piece module 6 also includes a latching shifting piece 14, and the latching shifting piece 14 is U-shaped. One end portion of the latching shifting piece 14 is provided with movable shafts 15 matched with the locking portion installing grooves 11, and the movable shaft 15 may move from a starting position of the locking portion installing groove 11 to an end position of the locking portion installing groove 11. A locking portion 9 is disposed at a bottom of the latching shifting piece 14, and two sides of the locking portion 9 have limiting grooves 17 matched with the limiting points 13. When the latching shifting piece 14 slides to the end position of the locking portion installing groove 11, the limiting points 13 are clamped in the limiting grooves 17 to limit the elastic range of the adjusting elastic arms 8. The locking portion 9 is configured to limit the elastic range of the two adjusting elastic arms 8 when the two adjusting elastic arms 8 are located at preset positions in the guiding groove 2 so that the adjusting shifting piece module 6 is fixed at the preset positions in the guiding groove 2. That is, when the latching shifting piece 14 is located at the starting position of the locking portion installing groove 11, the two adjusting elastic arms 8 may move in the guiding groove 2. When it is necessary to fix the adjusting shifting piece module 6 (power board bracket 3) at a certain position, the latching shifting piece 14 is moved to the end position of the locking portion installing groove. At this moment, the limiting point 13 is clamped in the limiting groove 17, i.e., the locking portion 9 is located between the two adjusting elastic arms 8 so that the adjusting elastic arms 8 cannot be deformed inward, resulting in that the adjusting elastic arms 8 cannot move in the guiding groove 2, and then the power board bracket 3 is fixed.

In an embodiment of the present application, the power board module may include a chassis 1, a power board bracket 3 and an adjusting shifting piece module 6.

A side wall of the chassis 1 has a guiding groove 2. Two inner side walls of the guiding groove 2 have sawtooth structures 26. Two ends of the guiding groove 2 have print fonts matched with lengths of power supplies to be installed, and the print fonts include 185 and 265. 185 indicates that the power supply to be installed is a 185 mm-long power supply, and 265 indicates that the power supply to be installed is a 265 mm-long power supply.

A power board 4 is fixedly installed on the power board bracket 3, and a side wall of the power board bracket 3 has an adjusting rod hanging groove 5.

The adjusting shifting piece module 6 includes an adjusting rod 10. One end of the adjusting rod 10 has an installing portion 7 matched with the adjusting rod hanging groove 5, and the other end of the adjusting rod 10 has an adjusting portion. A main body of the adjusting portion is provided with locking portion installing grooves 11, and an end portion of the adjusting portion has two adjusting elastic arms 8 parallel to each other. An outer side of an outermost end portion of each of the two adjusting elastic arms 8 is provided with a protruding portion 12 clamped with the guiding groove 2, and an inner side of the outermost end portion of each of the two adjusting elastic arms 8 is provided with a limiting point 13. The two adjusting elastic arms 8 are clamped with the sawtooth structure 26 of the two inner walls of the guiding groove 2, respectively, through the protruding portions 12. The two adjusting elastic arms 8 have a certain elasticity, and although the protruding portion 12 is clamped with the sawtooth structure 26, under the action of a force, the adjusting elastic arm 8 will be deformed inward so that the protruding portion 12 is detached from a currently clamped groove of the sawtooth structure 26 so that the adjusting shifting piece module 6 may move in the guiding groove 2. The top of the adjusting rod 10 has a first screw hole 18 and a fool-proof protrusion 19. The adjusting shifting piece module 6 also includes a latching shifting piece 14, and the latching shifting piece 14 is U-shaped. One end portion of the latching shifting piece 14 is provided with movable shafts 15 matched with the locking portion installing grooves 11, and the movable shaft 15 may move from a starting position of the locking portion installing groove 11 to an end position of the locking portion installing groove 11. The top of the latching shifting piece 14 further has a limiting concave point 20. A locking portion 9 is disposed at the bottom of the latching shifting piece 14, and two sides of the locking portion 9 have limiting grooves 17 matched with the limiting points 13. When the latching shifting piece 14 slides to the end position of the locking portion installing groove 11, the limiting points 13 are clamped in the limiting grooves 17 to limit the elastic range of the adjusting elastic arms 8. The locking portion 9 is configured to limit the elastic range of the two adjusting elastic arms 8 when the two adjusting elastic arms 8 are located at preset positions in the guiding groove 2 so that the adjusting shifting piece module 6 is fixed at the preset positions in the guiding groove 2. That is, when the latching shifting piece 14 is located at the starting position of the locking portion installing groove 11, the two adjusting elastic arms 8 may move in the guiding groove 2. When it is necessary to fix the adjusting shifting piece module 6 (power board bracket 3) at a certain position, the latching shifting piece 14 is moved to the end position of the locking portion installing groove. At this moment, the limiting point 13 is clamped in the limiting groove 17, i.e., the locking portion 9 is located between the two adjusting elastic arms 8 so that the adjusting elastic arms 8 cannot be deformed inward, resulting in that the adjusting elastic arms 8 cannot move in the guiding groove 2, and then the power board bracket 3 is fixed. The adjusting shifting piece module 6 also includes an adjusting handle 21. The adjusting handle 21 is provided with a second screw hole 22, and the first screw hole 18 is connected to the second screw hole 22 via a screw to connect the adjusting handle 21 and the adjusting rod 10 together. A bottom surface of the adjusting handle 21 is provided with a fool-proof hole 23 matched with the fool-proof protrusion 19 disposed on the adjusting rod 10 and the bottom surface of the adjusting handle 21 is provided with a limiting convex point 24 matched with the limiting concave point 20 arranged on the latching shifting piece 14. When the latching shifting piece 14 is located at the starting position of the locking portion installing groove 11, the limiting convex point 24 is clamped with the limiting concave point 20.

In an embodiment of the present application, the power board module may include a chassis 1, a power board bracket 3, an adjusting shifting piece module 6, and push pin guiding grooves 25.

A side wall of the chassis 1 has a guiding groove 2. Two inner side walls of the guiding groove 2 have sawtooth structures 26. Two ends of the guiding groove 2 have print fonts matched with lengths of power supplies to be installed, and the print fonts include 185 and 265. 185 indicates that the power supply to be installed is a 185 mm-long power supply, and 265 indicates that the power supply to be installed is a 265 mm-long power supply.

A power board 4 is fixedly installed on the power board bracket 3, and a side wall of the power board bracket 3 has an adjusting rod hanging groove 5. The bottom of the power board bracket 3 is also provided with push pins.

The adjusting shifting piece module 6 includes an adjusting rod 10. One end of the adjusting rod 10 has an installing portion 7 matched with the adjusting rod hanging groove 5, and the other end of the adjusting rod 10 has an adjusting portion. A main body of the adjusting portion is provided with locking portion installing grooves 11, and an end portion of the adjusting portion has two adjusting elastic arms 8 parallel to each other. An outer side of an outermost end portion of each of the two adjusting elastic arms 8 is provided with a protruding portion 12 clamped with the guiding groove 2, and an inner side of the outermost end portion of each of the two adjusting elastic arms 8 is provided with a limiting point 13. The two adjusting elastic arms 8 are clamped with the sawtooth structure 26 of the two inner walls of the guiding groove 2, respectively, through the protruding portions 12. The two adjusting elastic arms 8 have a certain elasticity, and although the protruding portion 12 is clamped with the sawtooth structure 26, under the action of a force, the adjusting elastic arm 8 will be deformed inward so that the protruding portion 12 is detached from a currently clamped groove of the sawtooth structure 26 so that the adjusting shifting piece module 6 may move in the guiding groove 2. The top of the adjusting rod 10 has a first screw hole 18 and a fool-proof protrusion 19. The adjusting shifting piece module 6 also includes a latching shifting piece 14, and the latching shifting piece 14 is U-shaped. One end portion of the latching shifting piece 14 is provided with movable shafts 15 matched with the locking portion installing grooves 11, and the movable shaft 15 may move from a starting position of the locking portion installing groove 11 to an end position of the locking portion installing groove 11. The top of the latching shifting piece 14 has a limiting concave point 20. A locking portion 9 is disposed at the bottom of the latching shifting piece 14, and two sides of the locking portion 9 have limiting grooves 17 matched with the limiting points 13. When the latching shifting piece 14 slides to the end position of the locking portion installing groove 11, the limiting points 13 are clamped in the limiting grooves 17 to limit the elastic range of the adjusting elastic arms 8. The locking portion 9 is configured to limit the elastic range of the two adjusting elastic arms 8 when the two adjusting elastic arms 8 are located at preset positions in the guiding groove 2 so that the adjusting shifting piece module 6 is fixed at the preset positions in the guiding groove 2. That is, when the latching shifting piece 14 is located at the starting position of the locking portion installing groove 11, the two adjusting elastic arms 8 may move in the guiding groove 2. When it is necessary to fix the adjusting shifting piece module 6 (power board bracket 3) at a certain position, the latching shifting piece 14 is moved to the end position of the locking portion installing groove. At this moment, the limiting point 13 is clamped in the limiting groove 17, i.e., the locking portion 9 is located between the two adjusting elastic arms 8 so that the adjusting elastic arms 8 cannot be deformed inward, resulting in that the adjusting elastic arms 8 cannot move in the guiding groove 2, and then the power board bracket 3 is fixed. The adjusting shifting piece module 6 also includes an adjusting handle 21. The adjusting handle 21 is provided with a second screw hole 22, and the first screw hole 18 is connected to the second screw hole 22 via a screw to connect the adjusting handle 21 and the adjusting rod 10 together. A bottom surface of the adjusting handle 21 is provided with a fool-proof hole 23 matched with the fool-proof protrusion 19 disposed on the adjusting rod 10 and the bottom surface of the adjusting handle 21 is provided with a limiting convex point 24 matched with the limiting concave point 20 arranged on the latching shifting piece 14. When the latching shifting piece 14 is located at the starting position of the locking portion installing groove 11, the limiting convex point 24 is clamped with the limiting concave point 20.

The push pin guiding groove 25 is arranged on a bottom surface perpendicular to the side wall of the chassis 1 and the push pin guiding groove 25 is L-shaped. The push pin guiding groove 25 has an installing groove and a sliding groove. The installing groove is perpendicular to the side wall of the chassis 1, and the sliding groove is parallel to the side wall of the chassis 1. An end portion of the installing groove has a push pin hole, and a size of the push pin hole is the same as the size of the push pin hole arranged at the bottom of the power board bracket 3. A diameter of the push pin hole is greater than a width of the installing groove. The push pin at the bottom of the power board bracket 3 is installed in the push pin hole. After the power board bracket 3 slides along the installing groove toward the side wall of the chassis 1, the power board bracket 3 may slide along the sliding groove to adjust a position of the power board bracket 3.

When the power board module of the present application is assembled, the power board 4 is installed on a set position of the power board bracket 3, and the installing portion 7 of the adjusting rod 10 is installed on the adjusting rod hanging groove 5 on the power board bracket 3 to form a fixed connection. The push pin at the bottom of the power board bracket 3 is aligned with the push pin hole of the push pin guiding groove 25 on the bottom surface of the chassis 1, and the power board bracket 3 is moved along the installing groove to the sliding groove. At this moment, the two adjusting elastic arms 8 on the adjusting rod 10 are clamped with the guiding groove 2. Then, the movable shaft 15 of the latching shifting piece 14 is installed at the starting position of the locking portion installing groove 11, the adjusting handle 21 is installed above the adjusting rod 10, and the adjusting handle 21 is connected to the adjusting rod 10 through the screw. When it is necessary to adjust the position of the power board bracket 3, the adjusting handle 21 is moved. The adjusting handle 21 drives the whole adjusting shifting piece module 6 to move along the guiding groove 2, and then drives the power board bracket 3 to move along the sliding groove. When it is necessary to fix the position, the movable shaft 15 of the latching shifting piece 14 is moved to the end position of the locking portion installing groove 11, and then the power board bracket 3 may be fixed. The power supply to be installed may be installed on the power board 4 from a power installation hole. The process of disassembling the module is the reverse of the above-mentioned process and will not be described again.

By using the technical solution of the present application, the installation of power supplies of different lengths may be facilitated, and the convenience of system maintenance may be increased, with the advantages of easy installation, low time cost, and high versatility, thereby product competitiveness is increased.

Based on the above-mentioned object, a server is provided by some embodiments of the present application. The server includes a power board module, and the power board module includes a chassis, a power board bracket and an adjusting shifting piece module.

A side wall of the chassis has a guiding groove.

A power board is fixedly installed on the power board bracket, and a side wall of the power board bracket has an adjusting rod hanging groove.

The adjusting shifting piece module has an installing portion matched with the adjusting rod hanging groove, and the installing portion is installed in the adjusting rod hanging groove. An end portion opposite to the installing portion has two adjusting elastic arms matched with the guiding groove, and the two adjusting elastic arms are clamped with two inner walls of the guiding groove, respectively. A locking portion for limiting an elastic range of the two adjusting elastic arms is disposed above the adjusting elastic arms, and the locking portion is configured to limit the elastic range of the two adjusting elastic arms when the two adjusting elastic arms are located at preset positions in the guiding groove so that the adjusting shifting piece module is fixed at the preset positions in the guiding groove.

In an embodiment of the present application, the adjusting shifting piece module includes an adjusting rod. One end of the adjusting rod has an installing portion matched with the adjusting rod hanging groove, and the other end of the adjusting rod has an adjusting portion. A main body of the adjusting portion is provided with locking portion installing grooves, and an end portion of the adjusting portion has two adjusting elastic arms parallel to each other. An outer side of an outermost end portion of each of the two adjusting elastic arms is provided with a protruding portion clamped with the guiding groove, and an inner side of the outermost end portion of each of the two adjusting elastic arms is provided with a limiting point.

In an embodiment of the present application, the adjusting shifting piece module includes a latching shifting piece, and the latching shifting piece is U-shaped. One end portion of the latching shifting piece is provided with movable shafts matched with the locking portion installing grooves, and the movable shaft may move from a starting position of the locking portion installing groove to an end position of the locking portion installing groove. A locking portion is disposed at the bottom of the latching shifting piece, and two sides of the locking portion have limiting grooves matched with the limiting points. When the latching shifting piece slides to the end position of the locking portion installing groove, the limiting points are clamped in the limiting grooves to limit the elastic range of the adjusting elastic arms.

In an embodiment of the present application, a top of the adjusting rod has a first screw hole and a fool-proof protrusion, and a top of the latching shifting piece has a limiting concave point.

In an embodiment of the present application, the server further includes an adjusting handle.

The adjusting handle is provided with a second screw hole, and the first screw hole is connected to the second screw hole via a screw to connect the adjusting handle and the adjusting rod together. A bottom surface of the adjusting handle is provided with a fool-proof hole matched with the fool-proof protrusion disposed on the adjusting rod and the bottom surface of the adjusting handle is provided with a limiting convex point matched with the limiting concave point arranged on the latching shifting piece. When the latching shifting piece is located at the starting position of the locking portion installing groove, the limiting convex point is clamped with the limiting concave point.

In an embodiment of the present application, the server further includes push pin guiding grooves.

The push pin guiding groove is arranged on a bottom surface perpendicular to the side wall of the chassis and the push pin guiding groove is L-shaped. The push pin guiding groove has an installing groove and a sliding groove. The installing groove is perpendicular to the side wall of the chassis, and the sliding groove is parallel to the side wall of the chassis. An end portion of the installing groove has a push pin hole, and a diameter of the push pin hole is greater than a width of the installing groove.

In an embodiment of the present application, two ends of the guiding groove have print fonts matched with lengths of power supplies to be installed, and the print fonts include 185 and 265.

In an embodiment of the present application, two inner side walls of the guiding groove have sawtooth structures.

In an embodiment of the present application, end portions of the two adjusting elastic arms have protruding portions matched with the sawtooth structures, and the protruding portions are tightly clamped with grooves of the sawtooth structures.

The above are merely preferred embodiments of the present application and are not intended to limit the present application in any way. A person skilled in the art may implement the present application smoothly as shown in the drawings of the specification and above. However, equivalent changes of some variations, modifications, and evolutions made by a person skilled in the art without departing from the scope of the technical solution of the present application utilizing the technical contents disclosed above are equivalent embodiments of the present application. Meanwhile, any variations, modifications, and evolutions of any equivalent changes made to the above embodiments according to the substantive technology of the present application still fall within the scope of the technical solution of the present application.

While embodiments of the present application have been illustrated and described, it will be understood by a person skilled in the art that various variations, modifications, substitutions, and alterations may be made to these embodiments without departing from the principles and spirit of the present application. The scope of the present application is defined by the appended claims and their equivalents.

The above-mentioned embodiments are possible examples of implementations and are proposed merely for a clear understanding of the principles of the present application. Many variations and modifications may be made to the above-mentioned embodiments without departing from the spirit and principles of the technology described herein. All modifications are intended to be included within the scope of the present disclosure and protected by the appended claims.

The invention claimed is:

1. A power board module, comprising:
a chassis, a side wall of the chassis having a guiding groove;
a power board bracket, wherein a power board is fixedly installed on the power board bracket, and a side wall of the power board bracket has an adjusting rod hanging groove; and
an adjusting shifting piece module, wherein the adjusting shifting piece module has an installing portion matched with the adjusting rod hanging groove, and the installing portion is installed in the adjusting rod hanging groove; an end portion opposite to the installing portion has two adjusting elastic arms matched with the guiding groove, and the two adjusting elastic arms are clamped with two inner walls of the guiding groove, respectively; a locking portion for limiting an elastic range of the two adjusting elastic arms is disposed above the adjusting elastic arms, and the locking portion is configured to limit the elastic range of the two adjusting elastic arms when the two adjusting elastic arms are located at preset positions in the guiding groove so that the adjusting shifting piece module is fixed at the preset positions in the guiding groove.

2. The power board module according to claim 1, wherein the power board is fixedly installed on the power board bracket, and the adjusting elastic arms move in the guiding groove to drive the power board on the power board bracket to move together in the chassis.

3. The power board module according to claim 1, wherein the adjusting shifting piece module comprises an adjusting rod; one end of the adjusting rod has the installing portion matched with the adjusting rod hanging groove, and the other end of the adjusting rod has an adjusting portion; a main body of the adjusting portion is provided with locking portion installing grooves, and an end portion of the adjusting portion has two adjusting elastic arms parallel to each other; an outer side of an outermost end portion of each of the two adjusting elastic arms is provided with a protruding portion clamped with the guiding groove, and an inner side of the outermost end portion of each of the two adjusting elastic arms is provided with a limiting point.

4. The power board module according to claim 3, wherein the adjusting shifting piece module comprises a latching shifting piece, and the latching shifting piece is U-shaped; one end portion of the latching shifting piece is provided with movable shafts matched with the locking portion installing grooves, and the movable shaft moves from a starting position of the locking portion installing groove to an end position of the locking portion installing groove; the locking portion is disposed at a bottom of the latching shifting piece, and two sides of the locking portion have limiting grooves matched with the limiting points; when the latching shifting piece slides to the end position of the locking portion installing groove, the limiting points are clamped in the limiting grooves to limit the elastic range of the adjusting elastic arms.

5. The power board module according to claim 4, wherein a top of the adjusting rod has a first screw hole and a fool-proof protrusion, and a top of the latching shifting piece has a limiting concave point.

6. The power board module according to claim 5, wherein the power board module further comprises:
an adjusting handle, wherein the adjusting handle is provided with a second screw hole, and the first screw hole is connected to the second screw hole via a screw to connect the adjusting handle and the adjusting rod together; a bottom surface of the adjusting handle is provided with a fool-proof hole matched with the fool-proof protrusion disposed on the adjusting rod, and the bottom surface of the adjusting handle is provided with a limiting convex point matched with the limiting concave point arranged on the latching shifting piece; when the latching shifting piece is located at the starting position of the locking portion installing groove, the limiting convex point is clamped with the limiting concave point.

7. The power board module according to claim 1, wherein the power board module further comprises:
push pin guiding grooves, wherein the push pin guiding grooves are arranged on a bottom surface perpendicular to the side wall of the chassis and are L-shaped; each of the push pin guiding grooves has an installing groove and a sliding groove; the installing groove is perpendicular to the side wall of the chassis, and the sliding groove is parallel to the side wall of the chassis; an end portion of the installing groove has a push pin hole, and a diameter of the push pin hole is greater than a width of the installing groove.

8. The power board module according to claim 7, wherein a bottom of the power board bracket has push pins; the push pin is installed with the push pin hole based on that the power board bracket slides along the sliding groove to adjust a position of the power board bracket after the power board bracket installed with the push pins slides along the installing groove toward the side wall of the chassis.

9. The power board module according to claim 1, wherein two ends of the guiding groove have print fonts matched with lengths of power supplies to be installed, and the print fonts comprise 185 and 265.

10. The power board module according to claim 1, wherein two inner side walls of the guiding groove have sawtooth structures.

11. The power board module according to claim 10, wherein end portions of the two adjusting elastic arms have protruding portions matched with the sawtooth structures, and the protruding portions are tightly clamped with grooves of the sawtooth structures.

12. The power board module according to claim 11, wherein the adjusting elastic arm controls detachment of the protruding portion from the currently clamped groove of the sawtooth structure based on an inward deformation to adjust movement of the adjusting shifting piece module in the guiding groove.

13. A server, wherein the server comprises a power board module, the power board module comprises:

a chassis, a side wall of the chassis having a guiding groove;

a power board bracket, wherein a power board is fixedly installed on the power board bracket, and a side wall of the power board bracket has an adjusting rod hanging groove; and an adjusting shifting piece module, wherein the adjusting shifting piece module has an installing portion matched with the adjusting rod hanging groove, and the installing portion is installed in the adjusting rod hanging groove; an end portion opposite to the installing portion has two adjusting elastic arms matched with the guiding groove, and the two adjusting elastic arms are clamped with two inner walls of the guiding groove, respectively; a locking portion for limiting an elastic range of the two adjusting elastic arms is disposed above the adjusting elastic arms, and the locking portion is configured to limit the elastic range of the two adjusting elastic arms when the two adjusting elastic arms are located at preset positions in the guiding groove so that the adjusting shifting piece module is fixed at the preset positions in the guiding groove.

14. The server according to claim 13, wherein the power board is fixedly installed on the power board bracket, and the adjusting elastic arms move in the guiding groove to drive the power board on the power board bracket to move together in the chassis.

15. The server according to claim 13, wherein the adjusting shifting piece module comprises an adjusting rod; one end of the adjusting rod has the installing portion matched with the adjusting rod hanging groove, and the other end of the adjusting rod has an adjusting portion; a main body of the adjusting portion is provided with locking portion installing grooves, and an end portion of the adjusting portion has two adjusting elastic arms parallel to each other; an outer side of an outermost end portion of each of the two adjusting elastic arms is provided with a protruding portion clamped with the guiding groove, and an inner side of the outermost end portion of each of the two adjusting elastic arms is provided with a limiting point.

16. The server according to claim 15, wherein the adjusting shifting piece module comprises a latching shifting piece, and the latching shifting piece is U-shaped; one end portion of the latching shifting piece is provided with movable shafts matched with the locking portion installing grooves, and the movable shaft moves from a starting position of the locking portion installing groove to an end position of the locking portion installing groove; the locking portion is disposed at a bottom of the latching shifting piece, and two sides of the locking portion have limiting grooves matched with the limiting points; when the latching shifting piece slides to the end position of the locking portion installing groove, the limiting points are clamped in the limiting grooves to limit the elastic range of the adjusting elastic arms.

17. The server according to claim 16, wherein a top of the adjusting rod has a first screw hole and a fool-proof protrusion, and a top of the latching shifting piece has a limiting concave point.

18. The server according to claim 17, wherein the server further comprises:

an adjusting handle, wherein the adjusting handle is provided with a second screw hole, and the first screw hole is connected to the second screw hole via a screw to connect the adjusting handle and the adjusting rod together; a bottom surface of the adjusting handle is provided with a fool-proof hole matched with the fool-proof protrusion disposed on the adjusting rod and, the bottom surface of the adjusting handle is provided with a limiting convex point matched with the limiting concave point arranged on the latching shifting piece; when the latching shifting piece is located at the starting position of the locking portion installing groove, the limiting convex point is clamped with the limiting concave point.

19. The server according to claim 13, wherein two inner side walls of the guiding groove have sawtooth structures; end portions of the two adjusting elastic arms have protruding portions matched with the sawtooth structures, and the protruding portions are tightly clamped with grooves of the sawtooth structures, wherein the adjusting elastic arm controls detachment of the protruding portion from the currently clamped groove of the sawtooth structure based on an inward deformation to adjust movement of the adjusting shifting piece module in the guiding groove.

20. A system, wherein the system comprises the power board module according to claim 1.

*     *     *     *     *